(12) United States Patent
Shinozaki

(10) Patent No.: US 7,894,238 B2
(45) Date of Patent: Feb. 22, 2011

(54) SEMICONDUCTOR MEMORY DEVICE WITH STACKED MEMORY CELL STRUCTURE

(75) Inventor: Naoharu Shinozaki, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 322 days.

(21) Appl. No.: 12/253,619

(22) Filed: Oct. 17, 2008

(65) Prior Publication Data

US 2009/0262569 A1  Oct. 22, 2009

(30) Foreign Application Priority Data

Oct. 17, 2007  (JP) .............................. 2007-270745

(51) Int. Cl.
*G11C 5/06* (2006.01)

(52) U.S. Cl. ........................ 365/148; 365/158; 365/163; 365/171; 365/173; 365/51; 365/63; 365/72; 365/130

(58) Field of Classification Search .................. 365/148, 365/158, 163, 171, 173, 51, 63, 72, 130
See application file for complete search history.

(56) References Cited

U.S. PATENT DOCUMENTS

| | | | |
|---|---|---|---|
| 6,448,661 B1 * | 9/2002 | Kim et al. ................... | 257/777 |
| 6,839,260 B2 * | 1/2005 | Ishii ............................ | 365/51 |
| 2001/0045645 A1 * | 11/2001 | Sasaki et al. ................ | 257/725 |
| 2006/0233012 A1 * | 10/2006 | Sekiguchi et al. ............ | 365/51 |
| 2007/0132049 A1 * | 6/2007 | Stipe ........................... | 257/421 |

\* cited by examiner

*Primary Examiner*—J. H. Hur

(57) ABSTRACT

A semiconductor device including: a first memory cell including a non-volatile first variable resistance element that stores data by varying a resistance value and a selection transistor that selects the first variable resistance element; a first memory layer provided with more than one such first memory cell arranged in a plane; a second memory cell including a non-volatile second variable resistance element that stores data by varying a resistance value and a selection diode that selects the second variable resistance element; and a second memory layer provided with more than one such second memory cell arranged in a plane; wherein more than one such second memory layer is stacked over the first memory layer.

10 Claims, 9 Drawing Sheets

SEMICONDUCTOR MEMORY DEVICE WITH STACKED MEMORY CELL STRUCTURE

CLAIM OF PRIORITY

This application claims priority from Japanese patent application 2007-270745 filed on Oct. 17, 2007

TECHNICAL FIELD

The present invention relates to a semiconductor device including a non-volatile memory that is electrically erasable and writable.

BACKGROUND ART

Recently, memory devices including non-volatile memory elements that store data by varying resistivity of variable resistors have been developed. Examples of such memory elements are a phase-change RAM (PRAM) that uses phase-change materials such as ternary chalcogenide, a colossal magnetoresistive effect (CMR) element that uses colossal magnetoresistance effects, and a resistive RAM (ReRAM) that uses variable resistance materials of transition metal oxide.

Writing data to the above enumerated memory elements is preformed by applying a voltage pulse of a predetermined condition to variable resistors in the memory elements, thereby varying resistance values of the variable resistors. Access control of the memory elements is performed via memory selection elements coupled to the memory elements.

Published Japanese Translation of PCT Application No. JP-T-2007-511895 discloses a conventional memory device that uses a transistor for a memory selection element. Published Japanese Translation of PCT Application No. JP-T-2005-522045 discloses a conventional memory device that uses a diode for a memory selection element. Japanese Patent Application Publication No. JP-A-2005-159359 discloses a conventional memory device that controls access to a memory element without using active elements such as a diode and a transistor.

Conventional semiconductor devices typically use variable resistive memory transistors or diodes for memory selection elements. Memory devices using transistors for memory selection elements are easy to control, and also high in reliability. Therefore, such memory devices are superior in data-holding performance and rewiring resistance. However, there is a disadvantage that, since a relatively large area is necessary for forming transistors, high integration of memory elements is difficult. Therefore, such memory devices are suitable for storing data, such as a boot program read during start-up and an OS, which require high reliability, but not suitable for storing data of large capacity.

Furthermore, memory devices using diodes for memory selection elements are suitable for increasing capacity since diodes can be formed in a smaller area compared to transistors and are also easier to stack vertically. However, access control to memory elements is performed by controlling a voltage level of bit lines and source lines coupled to the memory elements. Unfortunately, controlling the voltage can be difficult and unreliable. Accordingly, such memory devices are suitable for storing data with a large capacity such as moving image data or audio data, but unsuitable for storing important data on the other since their reliability is low and they are prone to cause problems such as disturbance and leakage. As such, in conventional memory devices, there is a problem that applicability thereof is limited depending on a characteristic of data to be stored.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A semiconductor device according to an aspect of the present invention includes: a first memory cell including a non-volatile first variable resistance element that stores data by varying a resistance value and a selection transistor that selects the first variable resistance element; a first memory layer provided with a plurality of the first memory cells arranged in a plane; a second memory cell including a non-volatile second variable resistance element that stores data by varying a resistance value and a selection diode that selects the second variable resistance element; and a second memory layer provided with a plurality of second memory cells arranged in a plane. A plurality of second memory layers is stacked over the first memory layer. According to this aspect of the present invention, data can be stored efficiently by selectively using the first memory layer and the second memory layer depending on a characteristic of data to be stored. Therefore, an increase in storage capacity and improvement of operation stability can be achieved at the same time. Further, by adopting a structure in which the plurality of second memory layers are stacked over the first memory layer, miniaturization and cost reduction of the semiconductor device can be achieved.

In this arrangement, the second memory cell may have the second variable resistance element and the selection diode stacked in a stacking direction of the first memory layer and the second memory layer. With this arrangement, high integration of the second memory layer can be further achieved.

In this arrangement, the area of the second memory cell may be smaller than that of the first memory cell when seen from a stacking direction of the first memory layer and the second memory layer. With this arrangement, high integration of the second memory layer can be further achieved.

In this arrangement, the second memory layer may include: a plurality of second bit lines; and a plurality of second word lines provided in a direction intersecting the plurality of second bit lines. The second memory cell may be provided in an intersection region of the second bit lines and the second word lines, one end thereof being coupled to one of the second bit lines and the other end thereof being coupled to one of the second word lines. Two vertically adjacent second memory layers among the plurality of second memory layers may share either the second bit line or the second word line. With this arrangement, the second memory layers can be formed thinner by sharing the second word line or the second bit line. Therefore, high integration of the second memory layer can be further achieved.

In this arrangement, of the two vertically adjacent second memory layers among the plurality of second memory layers, the second memory cell included in an upper layer and the second memory cell included in a lower layer may be provided being shifted for a half of a minimum machining dimension.

In this arrangement, the first memory cell may include: one such selection transistor; and one such first variable resistance element coupled to a drain terminal or a source terminal of the selection transistor. With this arrangement, since one such first variable resistance element is selected by one such selection transistor, operation reliability of the first memory cell can be improved.

In this arrangement, the semiconductor device may also include a semiconductor substrate supporting the first memory layer and the second memory layer. At least a part of the selection transistor is formed in the semiconductor substrate. With this arrangement, by effectively using the space of the semiconductor substrate, high integration of the first memory layer can be further achieved.

In this arrangement, the first memory layer may include: a selection transistor layer including the selection transistor; and a first variable resistance element layer including the first variable resistance element, the first variable resistance element layer being formed over the selection transistor layer. With this arrangement, since the first memory cells are formed vertically, high integration of the first memory layer can be further achieved.

In this arrangement, the first memory layer may include: a plurality of first bit lines; a plurality of first word lines provided in a direction intersecting the plurality of first bit lines; and a plurality of source lines provided in a direction along the plurality of first bit lines. The first memory cell is provided in an intersection region of the first bit lines and the first word lines, one end thereof being coupled to one of the first bit lines and the other end thereof being coupled to one of the source lines. Two adjacent first memory cells among the plurality of first memory cells share the source line. With this arrangement, since adjacent two first memory cells share the source line, high integration of the first memory layer can be further achieved.

In this arrangement, the variable resistance element may be made of transition metal oxide.

In this arrangement, the selection diode may be a Schottky diode made of the transition metal oxide and a metal electrode. With this arrangement, compared to a case of using a PN junction diode, the second memory cell can be miniaturized.

In this arrangement, the first memory cell may store data including at least one of a boot program read when turning on the power and an operating system (OS) program. With this arrangement, by storing the boot program or the OS program in the first memory cell having high operation reliability, operation stability of the semiconductor device can be improved.

The above-mentioned semiconductor device includes the first memory layer excellent in reliability of holding data and the second memory layer having large storage capacity. By selectively using these layers, data can be stored efficiently. Thereby, an increase in storage capacity and improvement of operation stability can be achieved at the same time. Further, by stacking the first memory layer and the second memory layer in a vertical direction, miniaturization and cost reduction of the semiconductor device can be achieved.

While the preferred embodiment of the present invention is described in details above, the present invention is not limited to the specific embodiment and, within the spirit and scope of the present invention as defined in the appended claims, various modifications and alterations may naturally be made.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1:
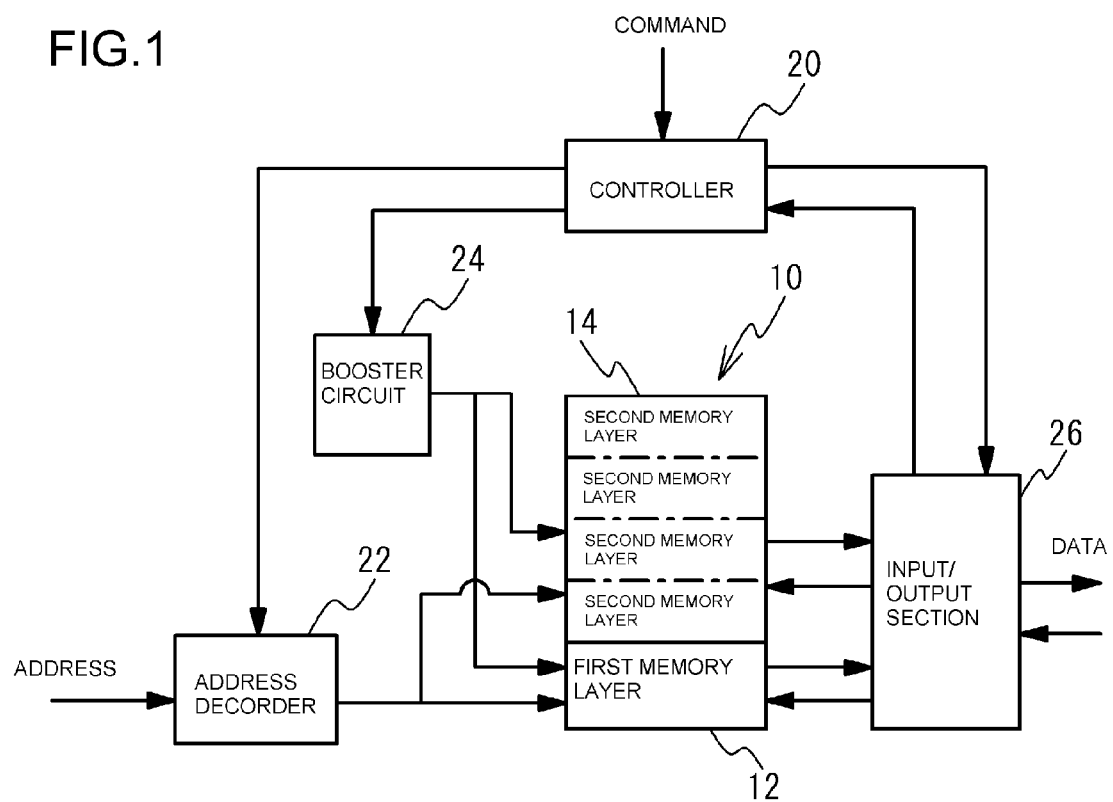
FIG. 1 is a block diagram showing a structure of a semiconductor device according to a first embodiment of the present invention.

FIG. 1 is a block diagram showing a structure of a semiconductor device according to one embodiment of the present invention. As depicted in FIG. 1, a memory 10 that is a region for storing data includes two storage regions of a first memory layer 12 and a second memory layer 14. The memory 10 has a three-dimensional structure, and a plurality of the second memory layers 14 is stacked over the first memory layer 12. A controller 20 controls, in accordance with a command input from the outside, an address decoder 22, a booster circuit 24, and an input/output section 26, and controls writing and reading of data to/from the memory 10. The address decoder 22 selects a memory cell in the memory 10 in accordance with an address signal input from the outside. The booster circuit 24 provides a high voltage to the memory 10 for writing data. The input/output section 26 exchanges data between the outside and the memory 10.

Figure 2:
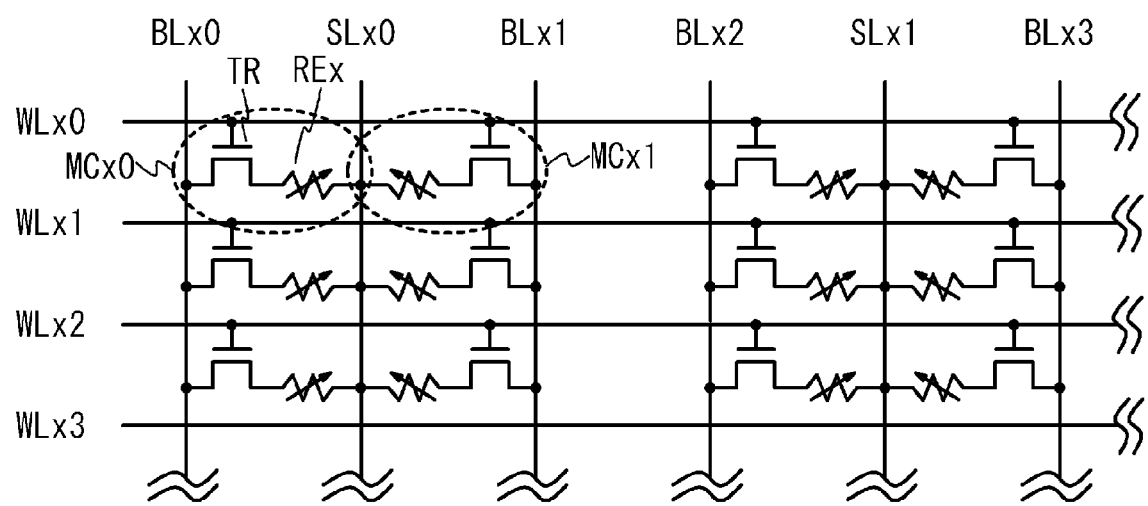
FIG. 2 is a circuit diagram showing a structure of a first memory layer.

FIG. 2 is a circuit diagram showing a structure of the first memory layer 12 shown in FIG. 1. The first memory layer 12 includes a plurality of first bit lines BLx, a plurality of word lines WLx provided in a direction intersecting the first bit lines BLx, and a plurality of first source lines SLx provided in a direction along the first bit lines BLx. In each intersection region of the first bit lines BLx and the word lines WLx, a first memory cell MCx is provided, and one end of the first memory cell MCx is coupled to one of the first bit lines BLx and the other end of the first memory cell MCx is coupled to one of the first source lines SLx. Two first memory cells MCx (for example, MCx0 and MCx1) adjacent to each other in the word lines WLx direction share a first source line SLx (for example, SLx0). As described above, in the first memory layer 12, more than one such first memory cell MCx is arranged in a plane. The number of the first memory cells MCx may be arbitrary depending on storage capacity.

The first memory cell MCx is composed of a first variable resistance element REx and a selection transistor TRx. A drain terminal of the selection transistor TRx is coupled to the first bit line BLx, a source terminal of the selection transistor is coupled to the first variable resistance element REx, and a gate terminal of the selection transistor is coupled to one of the word lines WLx. The other end of the first variable resistance element REx is coupled to the first source line SLx. The first memory cell MCx stores data by varying a resistance value of the first variable resistance element REx. For example, in a case where the first variable resistance element REx changes into either a high resistance state or a low resistance state, data of one bit can be stored per memory cell. The selection transistor TR selects the first variable resistance element REx by conducting the first variable resistance element REx and the first bit line BLx in accordance with a voltage applied to the gate terminal.

Figure 3:
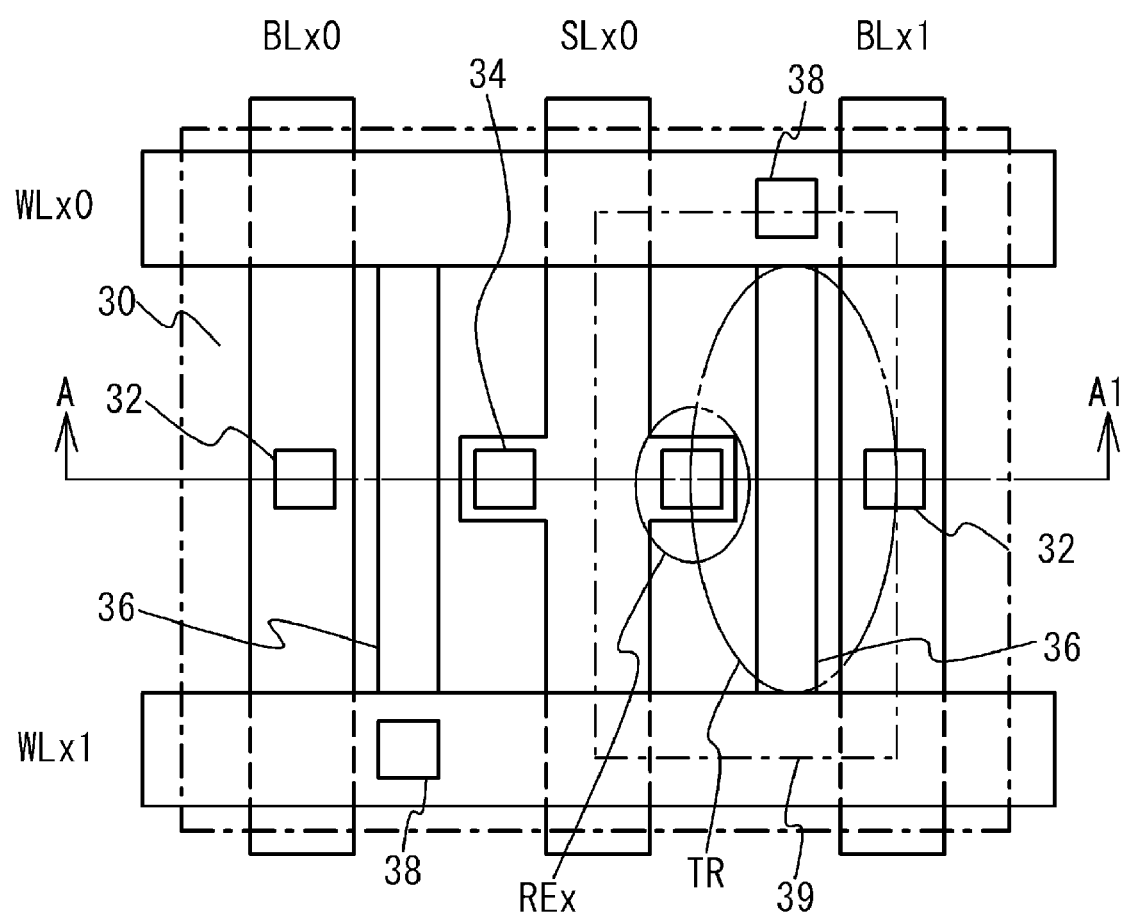
FIG. 3 is a top view showing the structure of the first memory layer.

FIG. 3 is a top view schematically showing a structure of the first memory cell MCx of FIG. 2. On an upper surface of a semiconductor substrate 30 supporting the first memory layer 12 and the second memory layer 14, a P-type well and N-type diffusion regions that are both not shown are formed (see FIG. 4). A bit line contact 32 is formed on the first bit line BLx, a source line contact 34 is formed on the first source line SLx, and they are respectively coupled to the diffusion regions formed below. The first variable resistance element REx is provided in the source line contact 34. The selection transistor TR is provided in a region including the semiconductor substrate 30 corresponding to the bit line contact 32 and the source line contact 34. A region between the first bit line BLx and the first source line SLx over the semiconductor substrate 30 is provided with a gate electrode 36 of the selection transistor TR. The gate electrode 36 is coupled to the word line WL by a word line contact 38.

The first memory cell MCx is formed in a region including the first variable resistance element REx and the selection transistor TR. The substantial size of the cell corresponds to a region 39 in FIG. 3. In a case where the minimum machining dimension is defined as F, the cell area of the first memory cell MCx can be $8F^2$ to $9F^2$, for example.

Figure 4:
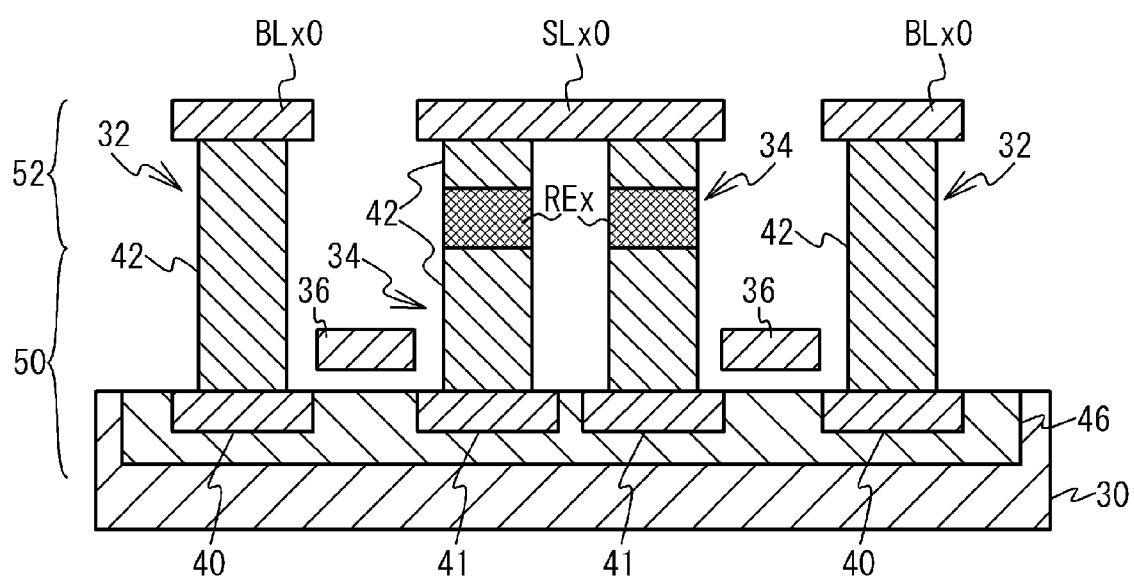
FIG. 4 is a cross-sectional view showing the structure of the first memory layer.

FIG. 4 is a schematic cross-sectional view along the line A-A1 in FIG. 3. A p-type well 46 is formed on the upper surface of the semiconductor substrate 30 made of, for example, silicon. N-type diffusion regions 40 and 41 are formed in the P-type well 46. The diffusion region 40 is the drain terminal of the selection transistor TR, and is coupled to the first bit line BLx via the bit line contact 32. The diffusion region 41 is the source terminal of the selection transistor TR, and is coupled to the first source line SLx via the source line contact 34. In the source line contact 34, the first variable resistance element REx is provided. The first variable resistance element REx is formed by using a resistance variation element made of transition metal oxide such as $CuO_2$. Further, phase-change materials such as ternary chalcogenide can be used. Either can arbitrarily vary the resistance value by applying a voltage pulse of a predetermined magnitude for a predetermined period of time. Further, wirings of the first bit line BLx, the first source line SLx, and the word line WLx can be formed with metals such as aluminum. The bit line contact 32 and the source line contact 34 can be formed by using a conductive material 42 including metals such as tungsten. Note that the illustration of insulating materials such as a gate oxide film and an interlayer insulating film are omitted in FIG. 4.

In this embodiment, by using, for example, a diffusion process, a part of the selection transistor TR (drain terminal and source terminal) is formed in the semiconductor substrate. Accordingly, by effectively utilizing a region that normally serves as a bulk, the semiconductor device can be miniaturized. Also, since the first variable resistance element REx is formed in the source line contact 34 of the selection transistor TR, the first memory layer 12 has a structure in which a first variable resistance element layer 52 including the first variable resistance element REx is provided over a selection transistor layer 50 including the selection transistor TR. By adopting such a stacked structure, the area of the first memory cell MCx can be reduced.

Figure 5:
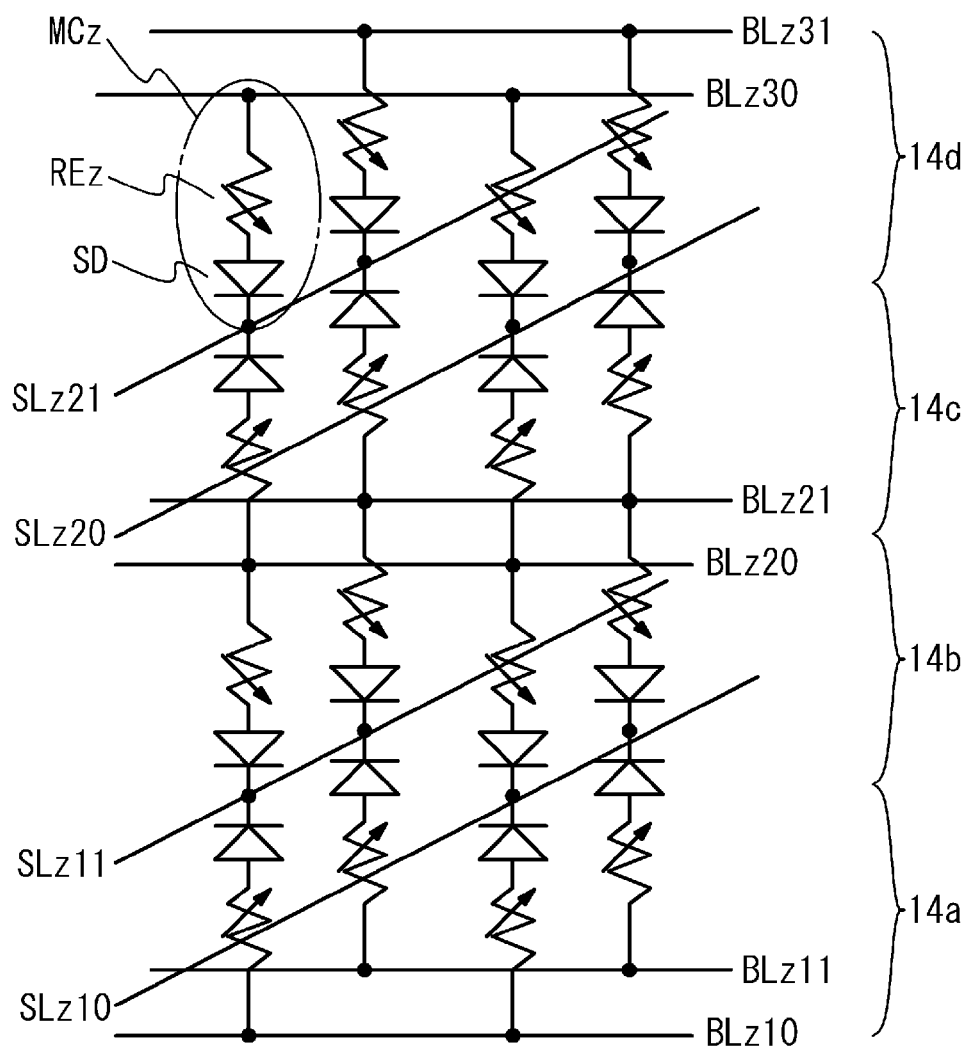
FIG. 5 is a circuit diagram showing a structure of a second memory layer.
Figure 6:
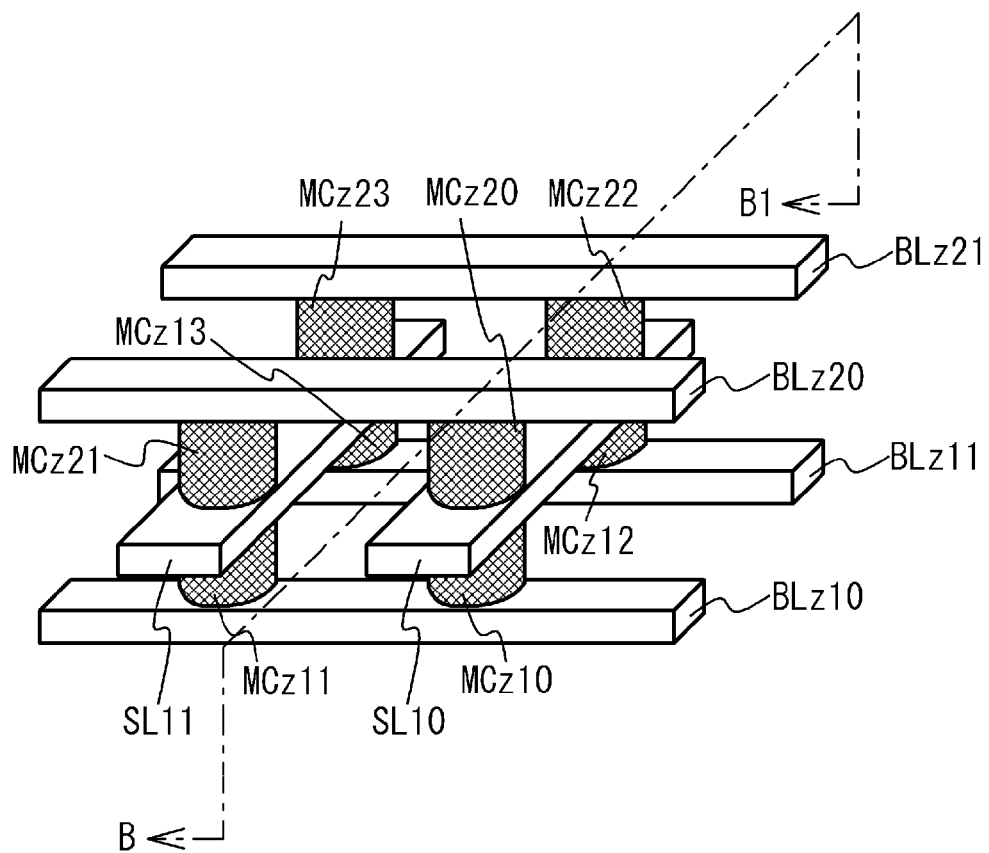
FIG. 6 is a perspective view showing the structure of the second memory layer.

FIG. 5 is a circuit diagram showing a structure of the second memory layer 14. FIG. 6 is a perspective view showing a structure of a part of FIG. 5. The second memory layer 14 is provided with a plurality of second bit lines BLz and a plurality of second source lines SLz provided in a direction intersecting the second bit lines BLz. In each intersection region of the second bit lines BLz and the second source lines SLz, a second memory cell MCz is provided, and one end thereof is coupled to one of the second bit lines BLz and the other end thereof is coupled to one of the second source lines SLz. As described above, more than one such second memory cell MCz is arranged in a plane. With reference to FIG. 5, a plurality of second memory layers 14a to 14d are stacked over the first memory layer 12 not shown. Among the plurality of second memory layers 14a to 14d, two vertically adjacent second memory layers share either the second bit line BLz or the second source line SLz. For example, the second memory layers 14a and 14b share second source lines SLz10 and SLz11. Accordingly, high integration of the second memory layer can be further achieved.

With reference to FIG. 5, the second memory cell MCz is structured to consist of one second variable resistance element REz and one selection diode SD. A cathode side of the selection diode SD is coupled to the second source line SLz, and an anode side thereof is coupled in series with the second variable resistance element REz. The other end of the second variable resistance element REz is coupled to the second bit line BLz. The second memory cell MCz stores data by varying a resistance value of the second variable resistance element REz as in the case of the first memory cell MCx. The selection diode SD selects the second variable resistance element REz in accordance with a potential difference between the second bit line BLz and the second source line SLz. In other words, when not selected, the second bit line BLz is set to low level and the second source line SLz is set to high level, whereby the selection diode SD is applied with a reverse bias, and no electric current flows into the second variable resistance element REz. When selected, the second bit line BLz is set to high level and the second source line SLz is set to low level, whereby the selection diode SD is applied with a forward bias, and electric current flows into the second variable resistance element REz.

Figure 7:
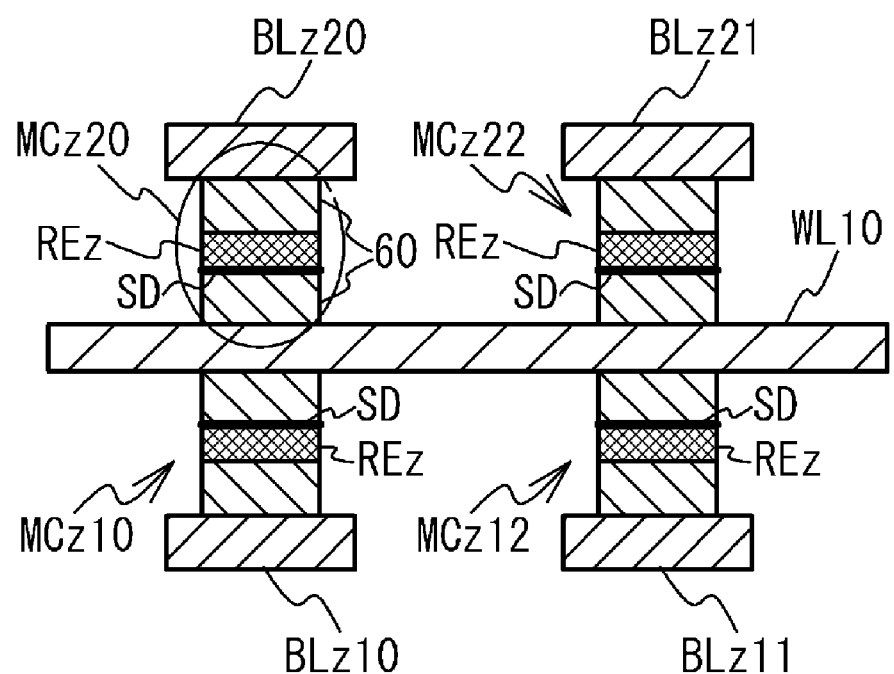
FIG. 7 is a cross-sectional view showing the structure of the second memory layer.

FIG. 7 is a cross-sectional view along the line B-B1 in FIG. 6. The second memory cell MCz is structured of the second variable resistance element REz and electrodes 60 provided on both ends thereof. By way of example, the second variable resistance element REz can be made of $CuO_2$ that is a transition metal oxide, and each electrode 60 can be made of Cu. Accordingly, a Schottky diode SD due to potential barrier is formed in a boundary of the second variable resistance element REz and the electrode 60. This corresponds to the selection diode SD in FIG. 5. By making the selection diode SD as a Schottky diode, the memory cell can be miniaturized relative to a case wherein a PN junction diode is used. Accordingly, the second memory cell MCz is structured by stacking the second variable resistance element REz and the selection diode SD in a stacking direction (vertical direction) of the first memory layer 12 and the second memory layer 14. Further, the second bit line BLz and the second source line SLz can be formed of metal wirings such as aluminum. As described above, by adopting a metal insulation metal (MIM) structure in which metals and insulators are stacked alternately, the memory cell can be easily stacked in the vertical direction.

Figure 8:
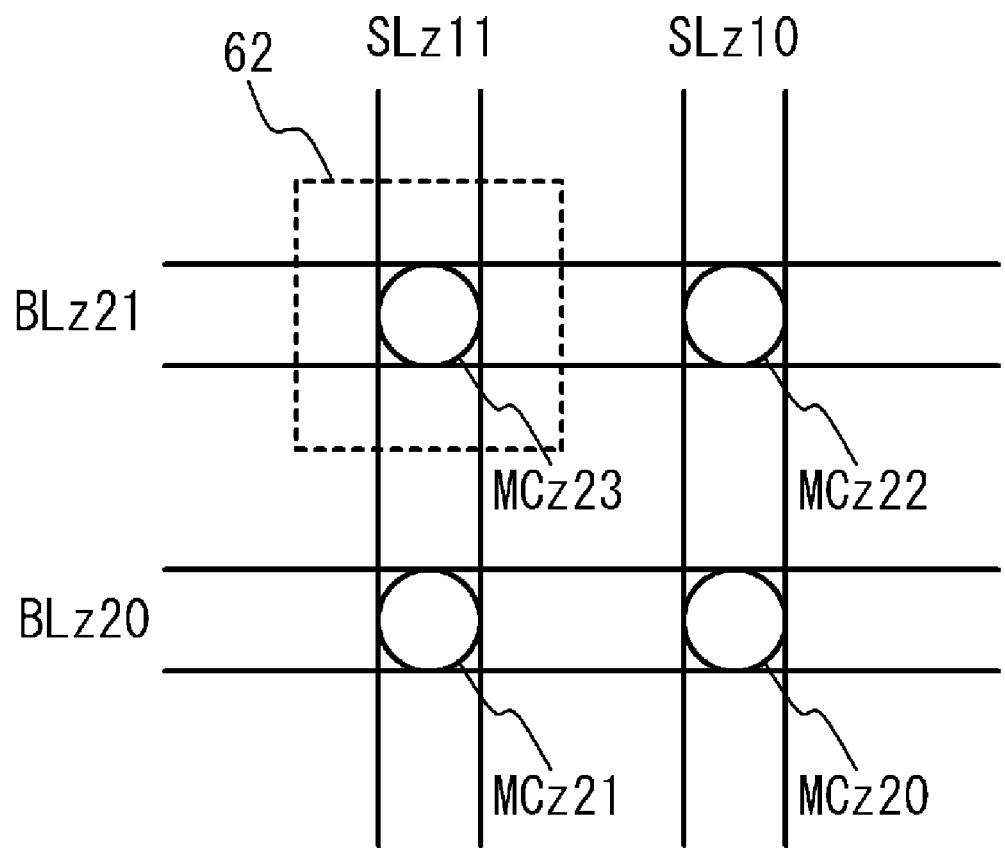
FIG. 8 is a top view showing the structure of the second memory layer.

FIG. 8 is a top view of FIG. 6. In the intersection region of the second bit lines BLz and the second source lines SLz, the second memory cell MCz is provided. The substantial size of the second memory cell MCz corresponds to a region 62, and is determined by the wiring width and the wiring spacing of the second bit lines BLz and the second source lines SLz. The second memory cell MCz uses a diode instead of a transistor for selecting a cell, whereby the area thereof is smaller than that of the first memory cell MCx when viewed in a stacking direction of the first memory layer 12 and the second memory layer 14. In a case where the minimum machining dimension is defined as F, the cell area of the second memory cell MCz is $4F^2$ that is equal to or less than half of the area of the first memory cell MCx ($8F^2$ to $9F^2$).

Figure 9A:
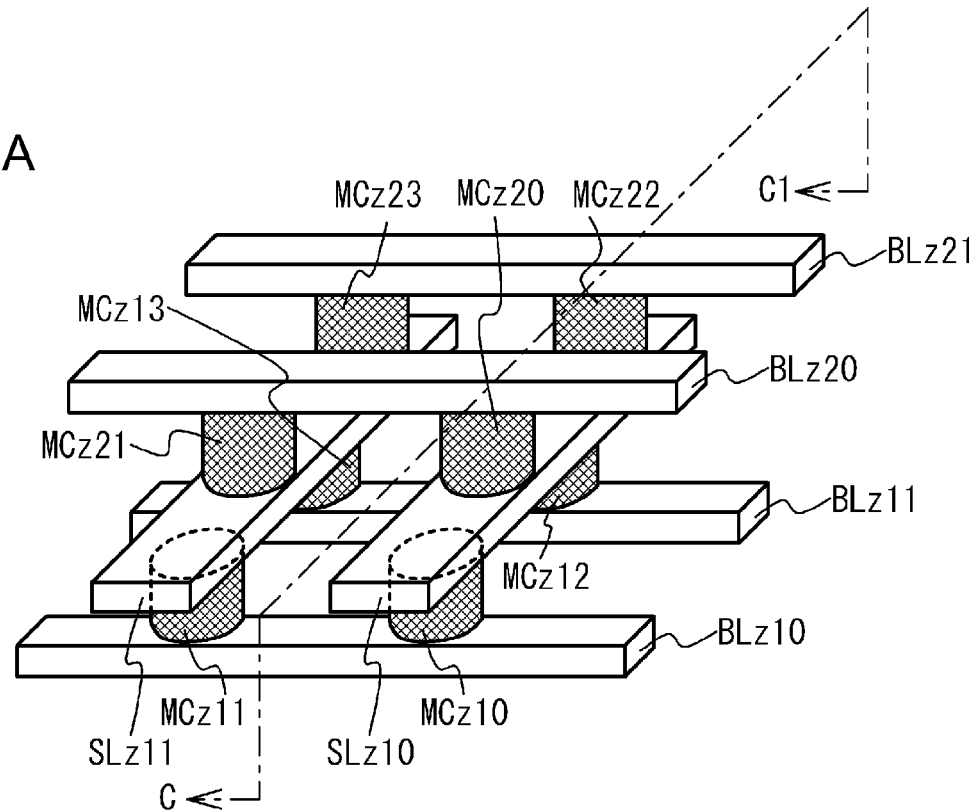
FIG. 9A is a perspective view showing a structure of an alternative mode of the second memory layer.
Figure 9B:
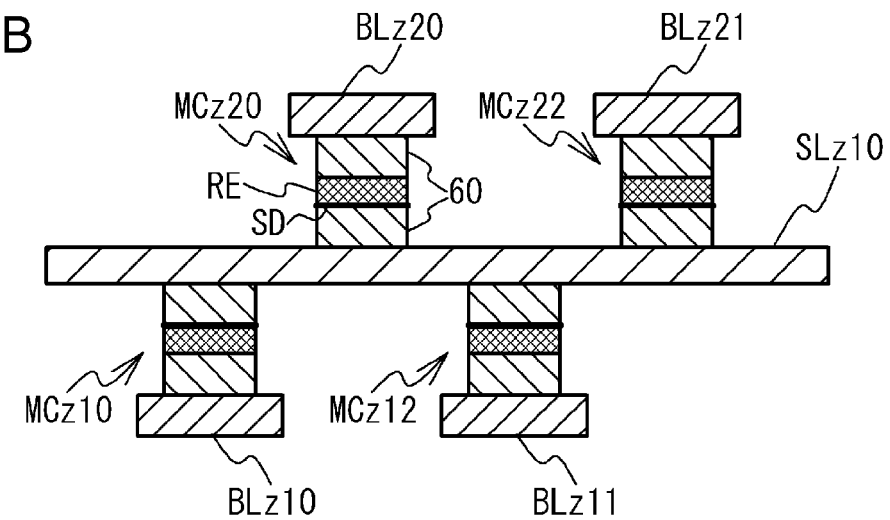
FIG. 9B is a cross-sectional view showing a structure of an alternative mode of the second memory layer.

In FIG. 6 to FIG. 8, the second memory cells MCz are arranged such that the upper and lower second memory cells MCz overlap with each other when viewed from a stacking direction of the first memory layer 12 and the second memory layer 14. However, a stacking method of the second memory cells MCz is not limited to this. For example, among vertically adjacent two second memory layers 14, the second memory cells (for example, MCz20 and MCz21) included in an upper layer and the second memory cells (for example, MCz10 and MCz11) included in a lower layer can be provided being shifted for a half of the minimum machining dimension F. FIG. 9A is a perspective view showing a structure of the second memory layer 14 having the second memory cells MCz arranged in such a manner. FIG. 9B is a cross-sectional view along the line C-C1 in FIG. 9A.

The semiconductor device according to the present embodiment of the present invention includes the first memory cell MCx selected by the selection transistor TR and the second memory cell MCz selected by the selection diode SD. Selection by the selection transistor TR is performed by controlling a voltage applied to the gate terminal of the selection transistor TR, therefore controlling is easy and reliability is high. Accordingly, data-holding performance and reliability of the first memory cell MCx are excellent. The first memory cell MCx stores data of high importance (hereinafter, core data) such as a basic program such as an OS and a boot program read when turning on the power. Accordingly, operation stability of the semiconductor device according to the present embodiment and electronic equipment in which the semiconductor device according to the present embodiment is built-in can be improved.

The selection of a memory cell by the selection diode SD is performed by controlling a voltage level of the bit line and the source line as explained with reference to FIG. 5. Therefore, controlling is difficult compared to controlling by using the selection transistor TR, and the reliability is low. As a result, in the second memory cell MCz selected by the selection diode SD, disturbance and leakage or the like of data are liable to occur compared to the first memory cell MCx. On the other hand, since the second memory cells MCz can be stacked, and the cell area of each of the second memory cells MCz is smaller than the cell area of each of the first memory cells MCx, it is easy to increase the capacity of the second memory cell MCz. Accordingly, data which may be partially damaged (for example, text data or image data generated by a user) or a large amount of data (for example, audio data or moving image data) are stored in the second memory cell MCz.

Accordingly, data can be stored efficiently by selectively using the first memory cell MCx and the second memory cell MCz (the first memory layer 12 and the second memory layer 14) in accordance with a characteristic of data. Consequently, the semiconductor device having a non-volatile memory can achieve an increase in storage capacity and improvement of operation reliability at the same time. Also, such semiconductor devices can easily be adapted to correspond to various applications.

The semiconductor device according to the present embodiment of the present invention adopts a structure in which the second memory layers 14 each including the second memory cell MCz are multiply stacked over the first memory layer 12 including the first memory cell MCx. As described above, since the first memory layer 12 includes the selection transistor TR, the first memory layer 12 may be unsuitable for stacking. On the other hand, since the second memory layer 14 includes the second variable resistance element REz and the selection diode SD formed in a vertical direction, the second memory layer 14 is suitable for stacking. Further, although a part of the selection transistor TR included in the first memory layer 12 can be formed in the semiconductor substrate, the second memory layer 14 cannot be formed directly on the semiconductor substrate. Therefore, at first, the first memory layer 12 having a capacity necessary for storing core data is formed in an area including the semiconductor substrate. Then, the second memory layer 14 suitable to stack is formed thereon in accordance with a required memory storage capacity. By adopting such three-dimensional structure, the memory area 10 can be structured in the most efficient manner. As a result, miniaturization and cost reduction of the semiconductor device can be achieved.

Further, with reference to FIG. 2, adjacent first memory cells MCx share the first source line SLx. With reference to FIG. 5, vertically adjacent second memory cells MCz share the second bit line BLz or the second source line SLz. Accordingly, by sharing a part of wirings between adjacent memory cells, the cell area can be reduced and the semiconductor device can be miniaturized.

In FIG. 2, the selection transistor TR is coupled to the first bit line BLx, and the first variable resistance element REx is coupled to the first source line SLx. However, the arrangements of the two are not limited thereto. For example, the first variable resistance element REx can be coupled to the first bit line BLx, and the selection transistor TR can be coupled to the first source line SLx. Further, as shown in FIG. 5, the selection diode SD is coupled to the second source line SLz, and the second variable resistance element REz is coupled to the second bit line BLz. However, the arrangement of the two is not limited thereto. For example, the second variable resistance element REz can be coupled to the second bit line BLz, and the selection diode SD can be coupled to the second source line SLz.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor device comprising:
   a first memory cell comprising a non-volatile first variable resistance element that stores data by varying a resistance value and a selection transistor that selects the first variable resistance element;
   a first memory layer comprising a plurality of first memory cells arranged in a plane;
   a second memory cell comprising a non-volatile second variable resistance element that stores data by varying a resistance value and a selection diode that selects the second variable resistance element; and
   a second memory layer provided with more than one such second memory cell arranged in a plane; wherein
   a plurality of second memory layers is stacked over the first memory layer.

2. The semiconductor device according to claim 1, wherein the second variable resistance element and the selection diode is stacked in the second memory cell in a stacking direction of the first memory layer and the second memory layer.

3. The semiconductor device according to claim 1, wherein an area occupied by the second memory cell is smaller than an area occupied by the first memory cell.

4. The semiconductor device according to claim 1, wherein the second memory layer comprises:
   a plurality of second bit lines; and
   a plurality of second word lines provided in a direction intersecting the plurality of second bit lines; wherein
   the second memory cell is provided in an intersection region of the plurality of second bit lines and the plurality of second word lines, one end of the second memory cell being coupled a second bit line and the other end of the second memory cell being coupled a second word line; and
   a plurality of vertically adjacent second memory layers comprised in the plurality of second memory layers share either a second bit line or a second word line.

5. The semiconductor device according to claim 1, wherein the first memory cell comprises:
   a selection transistor; and
   a first variable resistance element coupled to a drain terminal or a source terminal of the selection transistor.

6. The semiconductor device according to claim 1, further comprising:
   a semiconductor substrate supporting the first memory layer and the second memory layer; wherein
   at least part of the selection transistor is formed in the semiconductor substrate.

7. The semiconductor device according to claim 1, wherein the first memory layer comprises:
   a selection transistor layer comprising the selection transistor; and
   a first variable resistance element layer comprising the first variable resistance element, the first variable resistance element layer being formed over the selection transistor layer.

8. The semiconductor device according to claim 1, wherein the first memory layer comprises:
   a plurality of first bit lines;
   a plurality of first word lines provided in a direction intersecting the plurality of first bit lines; and
   a plurality of source lines provided in a direction along the plurality of first bit lines; wherein
   the first memory cell is provided in an intersection region of the first bit lines and the first word lines, one end of the first memory cell being coupled to a first bit line and the other end of the first memory cell being coupled to a source line; and
   a plurality of adjacent first memory cells comprised in the plurality of first memory cells share a source line.

9. The semiconductor device according to claim 1, wherein the selection diode is a Schottky diode comprising transition metal oxide and a metal electrode.

10. The semiconductor device according to claim 1, wherein the first memory cell stores data comprising at least one of:
    a boot program read when turning on the power; and
    an operating system OS program.

* * * * *